Feb. 25, 1964 E. H. BUCK 3,122,715

FREQUENCY CONVERTER SYSTEMS

Filed Oct. 14, 1960 2 Sheets-Sheet 1

Edwin H. Buck
INVENTOR.

BY William R. Sherman

ATTORNEY

Feb. 25, 1964 E. H. BUCK 3,122,715
FREQUENCY CONVERTER SYSTEMS
Filed Oct. 14, 1960 2 Sheets-Sheet 2

Edwin H. Buck
INVENTOR.
BY William R. Sherman
ATTORNEY

United States Patent Office 3,122,715

Patented Feb. 25, 1964

3,122,715

FREQUENCY CONVERTER SYSTEMS

Edwin H. Buck, Sarasota, Fla., assignor to Electro-Mechanical Research, Inc., Sarasota, Fla., a corporation of Connecticut Filed Oct. 14, 1960, Ser. No. 62,632
5 Claims. (Cl. 332—43)

This invention relates to frequency converter systems and more specifically to networks for converting low frequency low voltage intelligence signals into high frequency high amplitude modulated carrier signals.

In the field of telemetry, for example, changing physical phenomena are often translated into correspondingly low amplitude slowly varying electrical intelligence signals. In order to amplify these low voltage or current signals, it is conventional to first convert them into high frequency high amplitude alternating current signals having an envelope proportional to the magnitude of the intelligence signals, and then to demodulate the high frequency signals in order to recover the amplified intelligence data. This method of amplifying low voltage data signals eliminates the problem of drift in direct coupled amplifiers.

To chop the relatively low frequency intelligence signals, frequency converters often utilize either electromechanical or electronic switches. For low power chopper circuits, transistors can be advantageously employed as the switching elements. However, when so utilized, transistors do not function as ideal switches. An ideal switch should have no active energy sources across its terminals when it is in the On position. Transistors, however, when used as switches generate minute active energy sources between their "terminals." In addition, transistors also exhibit relatively high junction capacitances. These active energy sources and junction capacitances produce in the networks utilizing transistor switches transient currents which impose an undesirable lower limit on the ability of transistorized choppers to faithfully convert low voltage intelligence signals. When these transient currents become comparable in magnitude to the original data signals, the resulting distortion becomes for most applications prohibitively high.

Accordingly, it is an object of this invention to overcome the shortcomings of known choppers or modulators and to provide a circuit in which the deleterious effects of the inherent transient currents generated by electron discharge devices are greatly minimized.

It is another object of this invention to provide a circuit capable of chopping very low amplitude current signals.

A further object of this invention is to provide an amplitude modulator requiring a minimum of components and having a linear amplitude deviation characteristic for very low amplitude intelligence signals.

A still further object of this invention is to provide a stable and balanced-to-ground chopper circuit for frequency converting either single-ended or double-ended data signals and for rejecting most common mode signals.

Further objects, features and advantages of this invention will be apparent to a person skilled in the art upon further study of the specification and the accompanying drawings in which.

Figure 1:
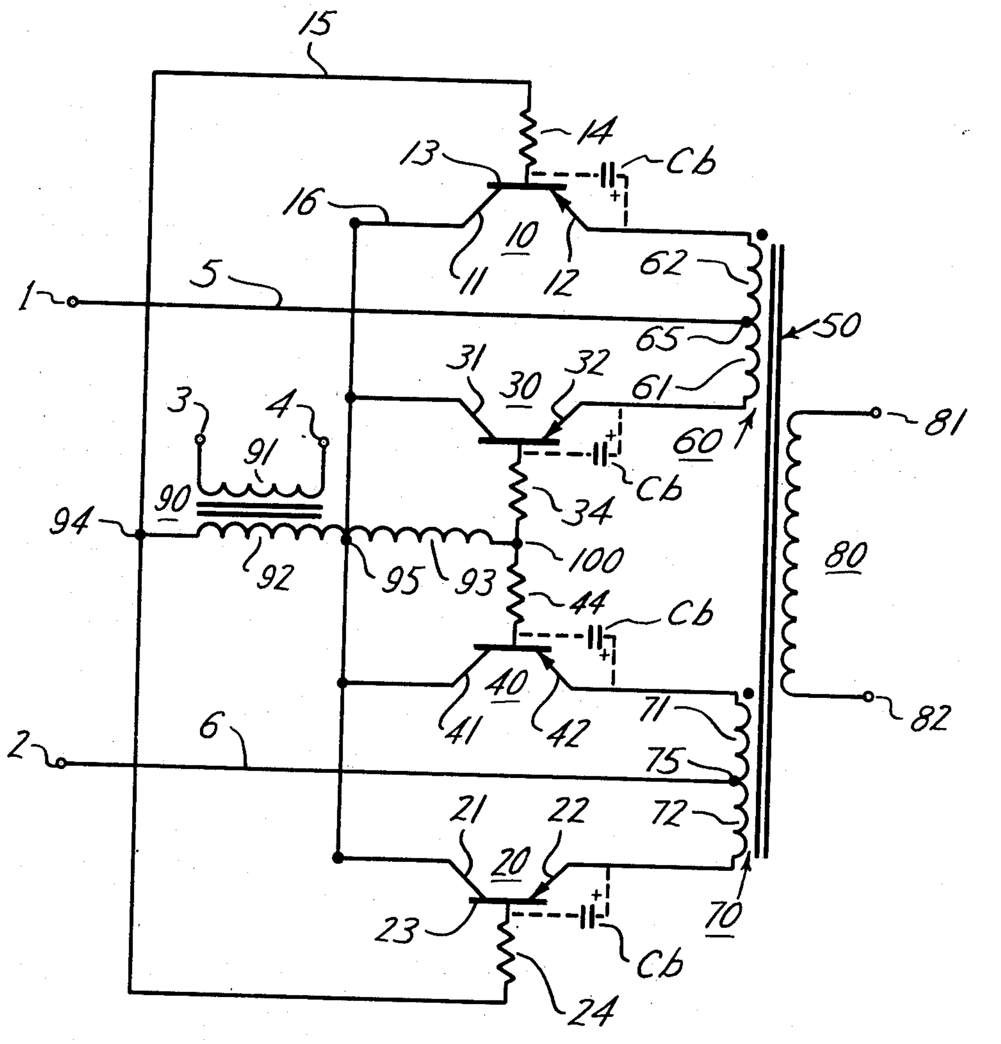
FIG. 1 is a circuit diagram of a preferred embodiment of this invention.
Figure 2:
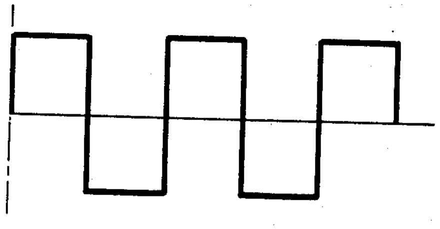
FIG. 2 is a graph of a suitable excitation signal.

In FIG. 1, transistor pairs 10, 20 and 30, 40 are arranged to conduct at alternate half cycles of the excitation signal shown in FIG. 2. Base 13 is connected to base 23 through resistor 14, wire 15 and resistor 24. Collectors 11, 21, 31 and 41 are connected through wire 16 to center tap 95 on the secondary winding of transformer 90. Emitter 12 is connected to emitter 32 and emitter 42 is connected to emitter 22 through windings 60 and 70 of transformer 50, respectively. The intelligence current signal between terminals 1 and 2 is applied through leads 5 and 6 to center taps 65 and 75 of windings 60 and 70, respectively. The excitation signal across terminals 3 and 4 is applied to primary winding 91 of transformer 90 whose secondary winding is connected between junctions 94 and 100. The amplitude modulated output signal is derived from terminals 81 and 82 of secondary winding 80. The polarities of windings 60 and 70 are indicated by the conventional dots.

Figure 5:
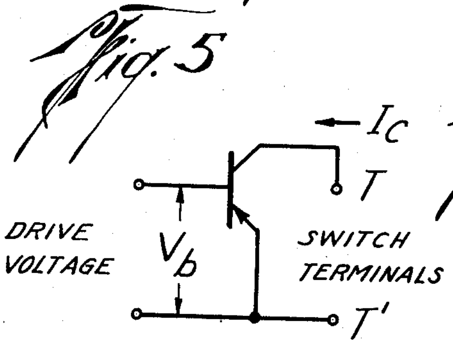
FIGS. 5 and 5(*a*) show respectively a transistor switch connection and its approximate equivalent circuit.
Figure 5A:
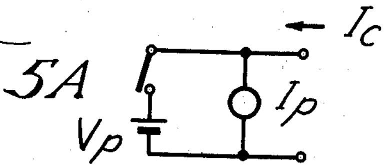

In FIG. 5 is shown a "normal" connection of a PNP junction transistor. A study of its characteristic curves reveals that the approximate equivalent circuit of the transistor when operated as a switch can be represented as shown in FIG. 5(*a*). In operation, a suitable value of base-emitter forward bias voltage $V_b$ will turn the switch On and collector current $I_c$ can be made to flow in either direction between the switch "terminals" T, T′. When the switch is On, a small D.-C. offset voltage $V_p$ appears across its collector-emitter terminals and when the bias is removed and the switch is Off, a small transient leakage current $I_p$ flows between its terminals.

Figure 6A:
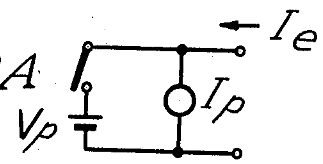
FIGS. 6 and 6(*a*) show respectively another transistor switch connection and its approximate equivalent circuit.
Figure 6:
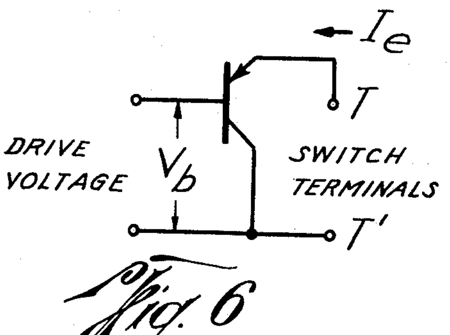

In FIG. 6 is shown an inverted connection of a PNP junction transistor and in FIG. 6(*a*) is shown its approximate equivalent circuit when operated as a switch. For a suitable value of base-collector forward bias voltage $V_b$, emitter current $I_e$ can be made to flow in either direction. The approximate equivalent circuit of the inverted connection is similar to the equivalent circuit of the normal connection shown in FIG. 5(*a*) except that the magnitude of $V_p$ is much smaller in the inverted connection.

For low level switching, the saturated transistors should have extremely low offset voltages and leakage currents. To meet the low leakage current condition it is preferred to use silicon transistors, and to meet the low voltage condition it is desirable to employ the inverted connection wherein the switch is turned On by forward biasing the collector-base junction. When two inverted transistor connections are mounted "back-to-back" (the collector and the base of one transistor are connected respectively to the collector and the base of the other transistor, and the excitation voltage is applied between the collector and the base junctions), the offset voltages $V_p$ become connected in series opposition and when equal they cancel each other out. Therefore, it is advantageous to use two inverted back-to-back transistors per switch.

In operation, during every half cycle the drive voltage applied to winding 91 induces two equal and opposite voltages in windings 92 and 93 of such polarity as to alternately turn On and Off the two pairs of transistor switches 30, 40 and 10, 20. The excitation voltage is preferably but not necessarily a square wave such as shown in FIG. 2.

First, assuming that during the first half cycle of the excitation voltage switches 30 and 40 are On and switches 10 and 20 are Off, the current from the intelligence source will flow from terminal 1 through lead 5, section 61, emitter 32, collector 31, junction 95, collector 41, emitter 42, section 71, center tap 75 and back to the other terminal 2 through lead 6. Since the currents in sections 61 and 71 flow in a direction away from the dots, they are in series aiding.

Conversely, during the other half cycle of the drive voltage, switches 30 and 40 are Off and switches 10 and 20 are On, the intelligence signal now flows from terminal 1 (or from terminal 2 depending on the voltages at terminals 1 and 2) through lead 5, junction 65, section 62, section 62, emitter 12, collector 11, wire 16, collector 21, emitter 22, section 72, center tap 75, and back to terminal 2 through wire 6. During this half cycle, the currents in sections 61 and 72 flow in a direction toward the dot, i.e., again in series aiding.

Figure 3:
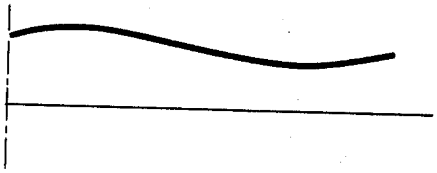
FIG. 3 is a graph of a typical low frequency data signal.
Figure 4:
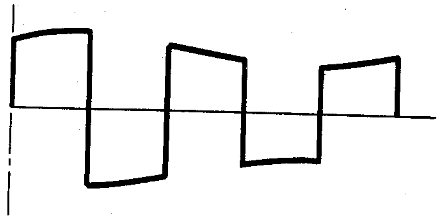
FIG. 4 is a graph of the resulting amplitude modulated high frequency output wave.

If transformer 50 is properly designed without appreciable losses, reversal in flux in windings 60 and 70 during each half cycle of the excitation voltage induces by transformer action a voltage signal in winding 80 having an amplitude envelope proportional to the intelligence signal. For a typical intelligence signal, such as shown in FIG. 3, the output wave across terminals 81 and 82 will have the form of a double-side-band suppressed carrier signal, as shown in FIG. 4. The envelope of the wave in FIG. 4 corresponds to the wave shape of the intelligence signal of FIG. 3.

The back-to-back connections of the two transistor pairs 10, 20 and 30, 40 assure that the offset voltages $V_p$ and the leakage currents $I_p$, described in connection with FIGS. 5 and 6, will be in series opposition and, therefore, when the parameter characteristics of the transistor pairs are properly matched, they will induce no appreciable signals in the output winding 80. Moreover, during the On time of each transistor switch, a voltage is developed across the relatively large (approximately 5 $\mu\mu$f.) emitter-base capacitor $C_b$, shown in dotted form in FIG. 1. These stray capacitances $C_b$ discharge, during the Off time of each transistor pair, transient currents into windings 60 and 70 in series opposition and, therefore, produce no net change in flux in the core of transformer 50. Thus, the stray voltages are eliminated from the output high frequency amplitude modulated signal.

An important advantage of the preferred embodiment in accordance with this invention resides in the fact that the circuit is completely symmetrical and balanced to ground.

As a result, various unpredictable stray capacitances and common mode currents are identical from either input lines 5 or 6 relative to a ground reference point or to the transformer secondary winding 80, thereby achieving a high degree of transient current suppression and common mode rejection from the output winding 80. Also, when no intelligence signal appears across input terminals 1 and 2, there will be no appreciable output current in winding 80. Moreover, stray voltages of equal polarity, with respect to a common ground reference point, coupled to input terminals 1 and 2 produce no net change in flux in the core of transformer 50, since any currents generated thereby in windings 60 and 70 are in series opposition. For example, for every stray current in winding 60 flowing away from the dot, there will be a corresponding current in winding 70 flowing toward the dot. Since currents in series opposition in the primary produce no net change in flux in the core of transformer 50, their deleterious effects will not appear in the output winding 80.

Separate resistors 14, 24, 34, and 44 are connected to bases 13, 23, 33 and 43, respectively, to keep the base drive currents constant with varying environmental conditions and to minimize the collector base voltage drop effect on the drive current in winding 91. Although no collector resistors are shown in FIG. 1, they may be provided, if desired, to balance out the transistor offset voltages, thereby minimizing any mismatch effects between the transistor parameter characteristics. The inductance of each transformer 50 and 90 should be high enough so that their respective cores can pass a square wave cursient currents flow in series opposition in windings 60 rent at the carrier frequency. Moreover, since the tranand 70 due to the symmetrical arrangement of the transistor switches, it is desirable to wind transformer 50 so that each of sections 61, 62, 71 and 72 has the same inductance value, thereby assuring maximum transient suppression.

Although the intelligence signal is shown in FIG. 3 as a slowly varying D.-C. signal, it should be understood that the circuit of FIG. 1 is capable of translating relatively high frequencies. For example, if the frequency of the driving square wave is 100 kc., the input data frequency may range from D.-C. to approximately 50 kilocycles. The higher limit on the intelligence frequency is imposed by the subsequent demodulating stages coupled to the output winding 80. Good results are obtained if the data frequency is approximately $\frac{1}{10}$ of the driving frequency.

Though the circuit was described as a chopper of relatively slow varying intelligence signals, its use is not so limited. For example, it can also be efficiently utilized as an amplitude modulator producing a double-side-band suppressed carrier. For this application, if the excitation voltage is the carrier and the intelligence voltage is the modulating signal, the output wave will be a double-side-band amplitude modulated suppressed carrier wave as shown in FIG. 4. The amplitude envelope of the modulated wave is proportional to the modulating signal. Since such a modulator can suppress the effects of inherent transients generated by the transistors and by the common mode stray voltages, its usefulness is greatly extended to accommodate extremely low amplitude modulating signals without suffering a corresponding loss in the linearity of its amplitude deviation ratio.

The two pairs of transistor switches are driven by transformer 90 in order to better isolate the input terminals 1 and 2 from ground. However, when no such isolation is desired, the switch pairs can be directly driven.

Under low voltage level operations, it is often necessary to provide floating inputs to insure good common mode rejection. From the description of the operation of the preferred embodiment shown in FIG. 1, it will be apparent that this frequency converter and amplifier provides complete isolation between the input circuits coupled to terminals 1 and 2 and the output circuits coupled to terminals 81 and 82. Because of this isolation, the load on the chopper connected to the output terminals can be either single-ended with one side grounded, if desired, or double-ended in the manner shown in FIG. 1. Similarly, the intelligence source can also be either floating above ground or grounded, as desired.

While a specific converter circuit was shown and described above, it will be appreciated by those skilled in the art that various modifications can be made within the scope of this invention as defined in the appended claims.

What is claimed is:

1. A circuit for converting low frequency signals into high frequency signals comprising in combination: a transformer having a core, at least two primary windings and a secondary winding, said primary and secondary windings being wound on said core; said primary windings including a first, second, third and fourth section, a first switching means interconnecting said first and said fourth sections, a second switching means interconnecting said second and said third sections; means for applying said low frequency signals between the junction of said first and said second sections and the junction of said third and said fourth sections; and energizing means operatively coupled to said first and said second switching means to alternately turn them On and Off thereby inducing in said secondary winding a high frequency wave whose envelope corresponds to the amplitude of said intelligence signals, said energizing means including a source of alternating current signals for supplying during each half cycle an energizing current to said first or second switching means dependent upon the polarity of said energizing current, said energizing current flowing in a path excluding said primary windings.

2. A circuit for converting relatively low frequency intelligence signals into relatively high frequency signals comprising in combination: a transformer having a core, at least two primary windings and a secondary winding, said primary and secondary windings being wound on said core; said primary windings including a first, second, third and fourth section; a first pair of transistor switching means interconnecting said first and said fourth sections, a second pair of transistor switching means interconnecting said second and said third sections; means for applying said low frequency signals between the junction of said first and said second sections and the junction of said third and said fourth sections; and current biasing means operatively connected to said first and said second transistor switching means to alternately turn them On and Off thereby generating in said secondary winding a high frequency wave whose envelope corresponds to the amplitude of said intelligence signals.

3. A circuit for converting relatively low frequency data signals into relatively high frequency signals comprising in combination: a transformer having a core, at least two primary windings and a secondary winding, said primary and secondary windings being wound on said core; said primary windings including a first, second, third, and fourth section; a first pair of semiconductor switching means interconnecting said first and said fourth sections, a second pair of semiconductor switching means interconnecting said second and said third sections; means for applying said data signals between the junction of said first and said second sections and the junction of said third and said fourth sections, current energizing means connected to said first and said second semi-conductor switching means to alternately turn them On and Off at a frequency corresponding to said high frequency signals thereby producing in said secondary winding said high frequency signals.

4. A circuit for converting low frequency signals into high frequency signals comprising in combination: a transformer having a core, having at least two primary windings and a secondary winding, said primary and secondary windings being wound on said core; said primary windings including a first, second, third and fourth section; a first, second, third and fourth signal translating device, each translating device having a common electrode, a control electrode and an output electrode; means for connecting said first section to the output electrode of said first translating device, means for connecting said fourth section to the output electrode of said second translating device, means for connecting the control electrode of said first translating device to the control electrode of said second translating device, means for connecting said second section to the output electrode of said third translating device, means for connecting said third section to the output electrode of said fourth translating device, means for connecting the control electrode of said third translating device to the control electrode of said fourth translating device; means for applying said low frequency signals between the junction of said first and said second sections and the junction of said third and said fourth sections; means for connecting the common electrode of said first translating device to the common electrode of said second translating device, means for connecting the common electrode of said third translating device to the common electrode of said fourth translating device; and an excitation signal source operatively coupled to each common electrode-control electrode circuit to periodically turn each translating device On and Off thereby generating in said secondary winding said high frequency signals.

5. A circuit for converting relatively low frequency intelligence signals into relatively high frequency amplitude modulated signals comprising in combination: a transformer having a core, having at least two primary windings and a secondary winding, said primary and secondary windings being wound on said core; said primary windings including a first, second, third and fourth section; a first, second, third and fourth transistor each transistor having a base, an emitter and a collector electrode; means for connecting said first section to the emitter of said first transistor, means for connecting said fourth section to the emitter of said second transistor, means for connecting the collector of said first transistor to the collector of said second transistor, means for connecting said second section to the emitter of said third transistor, means for connecting said third section to the emitter of said fourth transistor, means for connecting the collector of said third transistor to the collector of said fourth transistor; means for applying said intelligence signals between the junction of said first and said second sections and the junction of said third and said fourth sections; means for connecting the base of said first transistor to the base of said second transistor, means for connecting the base of said third transistor to the base of said fourth transistor; and an excitation signal source operatively coupled to each base-collector circuit to periodically turn said first-second and said third-fourth transistors On and Off thereby producing in said secondary winding a high frequency wave whose envelope corresponds to the amplitude of said intelligence signals.

References Cited in the file of this patent

UNITED STATES PATENTS

| | | |
|---|---|---|
| 2,872,582 | Norton | Feb. 3, 1959 |
| 2,937,342 | Wellman | May 17, 1960 |
| 2,943,271 | Willis | June 28, 1960 |
| 3,044,025 | McCauley | July 10, 1962 |

FOREIGN PATENTS

| | | |
|---|---|---|
| 203,165 | Australia | Aug. 27, 1956 |